June 24, 1958 C. C. RAYBURN ET AL 2,840,134

MODULE MOUNTING DEVICE HAVING CAM ACTUATED, PIVOTALLY MOUNTED TAB BENDING ARMS

Filed Oct. 25, 1954 3 Sheets-Sheet 1

INVENTORS
CHARLES C. RAYBURN
HAROLD M. HORSMAN

BY

Wayne M. Hart
ATTORNEY

INVENTORS
CHARLES C. RAYBURN
HAROLD M. HORSMAN

BY

Wayne M. Hart
ATTORNEY

MODULE MOUNTING DEVICE HAVING CAM ACTUATED, PIVOTALLY MOUNTED TAB BENDING ARMS

Filed Oct. 25, 1954

INVENTORS
CHARLES C. RAYBURN
HAROLD M. HORSMAN

BY

Wayne M. Hart
ATTORNEY

United States Patent Office 2,840,134

Patented June 24, 1958

2,840,134

MODULE MOUNTING DEVICE HAVING CAM ACTUATED, PIVOTALLY MOUNTED TAB BENDING ARMS

Charles C. Rayburn, Fairfax County, and Harold M. Horsman, Alexandria, Va., assignors to ACF Industries, Incorporated, New York, N. Y., a corporation of New Jersey Application October 25, 1954, Serial No. 465,618

6 Claims. (Cl. 153—17)

This invention relates to improvements in devices for assembling special articles.

With the advent of new electronic techniques involving both circuit wiring and components, one of the problems which has been presented is finding a simple way of connecting wires to processed circuit boards, that is, insulating bodies on which circuitry lines are formed usually by one of the graphic art techniques. In at least one type of electronic equipment having special assembly techniques, a large number of wires are passed through apertures in a circuit board in order to mount modules containing insulating supporting panels on which components are carried. In the past, that is, during the last six or seven years, several different constructions have been conceived in order to avoid all of the difficulty of making the solder connections or holding the parts together while soldering. An object of the present invention is to provide a machine which holds the circuit board stationary during the time that tools bend the wires over the edges of the circuit board so as to fasten the wires to the circuit board, thereby also fastening the modules which include the wires in their construction. In this way the module or modules are mechanically assembled with the circuit board so that subsequent soldering operations may be performed with a minimum of difficulty. This is true in that the modules are very firmly connected to the circuit board and will not move. In fact, the mechanical connection has proved to be of such strength that it is completely sufficient for anchoring purposes and the solder connections are made only for electrical conductivity reasons.

The assembling machine is designed primarily for use in connection with the previously mentioned type of modules. Present plans are for modules having twelve wires and an indefinite number of equally spaced ceramic supports which are fixed to the wires. A more specific object of the invention is to provide a machine for assembling such modules to circuit boards which machine has a special fixture with a resilient seat in it yieldingly accommodating the lowermost ceramic module support, a fixed surface on which the circuit board is adapted to rest, together with a head which is movable toward said fixture, and having centering devices which come into contact with the circuit board, pressing it downwardly in order to push the module against the spring bias of said seat until the circuit board comes to rest firmly upon the stationary part of the fixture. The machine includes in its head means to thereafter fit beside the wires of the module which project above the top surface of the circuit board and to bend them over on top of the circuit board. All of this takes place in one movement of the head toward the circuit board and module, after which the head is withdrawn for a separate operation.

A more specific application of the invention is in connection with fastening modules to circuit boards where the circuit boards are formed with a single aperture for each module so that all of the wires of one module pass through the aperture simultaneously. It is another object of this invention to provide means in the machine which fit within the board aperture during the time that the wires are being bent over in order to prevent any lateral movement or slipping of the circuit board during this operation.

Other objects and features of importance, such as simplicity of construction, will become apparent in following the description of the illustrated form of the invention.

Figure 1:
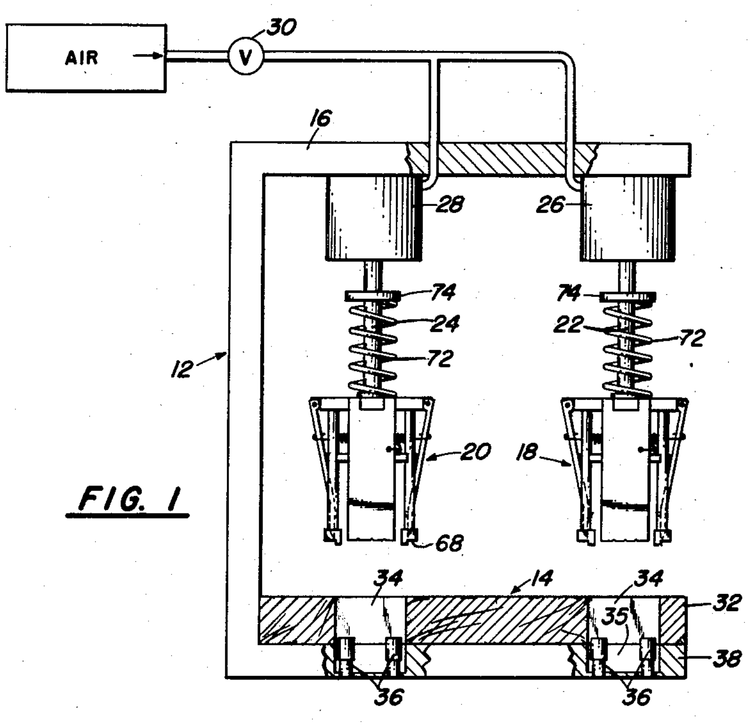
Fig. 1 is an end view showing schematically the arrangement of parts in an assembly machine which uses the principles of the invention.

With the growth of the field of electronics, the complexity of the equipment developed and put into use soon reached the point where interest in certain old but little known circuit manufacturing techniques has been revived. They utilize one or more of the graphic art methods for production of circuitry and/or components upon one or more surfaces of a board, usually a dielectric board. With this revival of interest and use, new assembly methods were adopted. One of these methods involves modular construction which is essentially one or more modules containing circuit components. A module M is shown in the drawing (Figs. 2 and 3) and consists of five wafers W of ceramic material, each being a support for a component and held apart in a unit by means of twelve conductive wires 10, there being three wires on each of the sides of the generally square wafers W. Such modules contain circuitry, but usually not enough to constitute all of the circuitry necessary to a complete unit of electronic equipment. For example, a black and white television receiver of average cost would require about fifteen modules of the size shown in the drawing in order to mount the majority of components.

Therefore, some means of mechanically mounting the modules and electrically connecting the same must be devised. The use of circuit boards has been successful, but it is difficult to connect modules and specifically, the dozen wires of each module to the circuit board. This would mean, for the hypothetical television receiver, 180 solder connections to the circuit board. Merely making the solder connections is not the most difficult procedure. Patents have issued showing that the art has advanced sufficiently so that solder connections may be made rapidly to circuit boards. In this connection attention is invited to Patent No. 2,671,264 of March 9, 1954, issued to Leopold Pessel. However, note that the components illustrated in the patent drawing have terminals which are passed through small holes in the "printed" circuit board. This is not the optimum manufacturing technique for the reason that it is time consuming to insert a small wire into a small hole in a board. Moreover, unless the wire fits the hole very tightly, which makes inserting difficult, some provision has to be made for holding the component wire projected through the board while soldering operations are carried on.

In Fig. 1 the machine shown comprises a suitable support 12 together with a fixture 14 carried by the support and an overhead beam 16 on which are carried movable heads 18 and 20, each being identical in construction. The heads will be described in detail subsequently. However, it is to be understood that these heads are movable downwardly in the direction of their fixtures 14 in order to perform their operation, and the means for providing the motive force may be selected from known technology. An ideal selection would be an air system leading to cylinders 26 and 28 into which piston structures 22 and 24 extend. A suitable control valve 30 would be provided in the line leading from the source of air to the cylinders 26 and 28 in order to have the necessary operator or automatic control.

The fixture 14 consists of plants 32 and 38, preferably constructed of hard wood and having fixture elements in it to accommodate modules M. Plate 32 has apertures 34 therethrough registering with pockets 35 in plate 38, the pockets being open at the top and having one or more resilient lands 36 seated in bottom thereof. The resilient lands 36 may comprise spring loaded small plungers or merely springs secured in the pockets of base plate 38. The lands accommodate the modules in the apertures 34 while the circuit board B is adapted to rest on the top surface of panel 32.

The construction of head 18, for example is seen best by examination of Figs. 2–6, inclusive. There is a frame 40 through which one of the pistons, for example, piston 22, is slidably mounted. Four guides 42, 46, 48 and 50 extend from frame 40 and form a guideway for the cam or spreader member 51. Cam 51 has grooves for receiving the guides 42, 46, 48 and 50 are in nesting relation with cam 51. Piston 22 is secured to the cam 51 in order to move the cam with respect to the guides 42, 46, 48 and 50 and also, in order to transmit reciprocating motion to the entire head, necessary for its intended operation.

Figure 6:
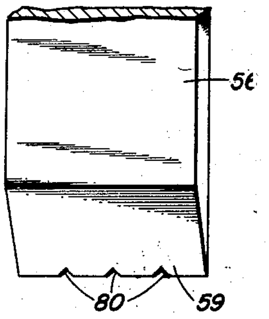
Fig. 6 is a fragmentary view of one of the tools used to bend the wires showing particularly the wire guides formed in the lower edge of the tool.

Since the module M is a four sided polygon, four tools 52, 54, 56 and 58, respectively, are displaceably carried by the plate frame member 40. Pivot connections as at 60, are used for making the connection of the tools with the frame. In construction, each tool is a generally flat bar having a cam surface on the inner side thereof and tapered to a lower serrated edge 59 having grooves 80 therein (Fig. 6). The inner cam surface of each tool is in contact with cam or spreader 51 and firm contact therebetween is assured by use of a pair of springs 64 and 66, respectively, which are connected to opposite tools and which bias the tools against the cam 51.

Means 67 for holding board B firmly fixed on the fixture 14 during the wire bending operation and also for centering the aperture 65 in the circuit board with respect to the head are provided on the lower ends of the guides 42, 46, 48 and 50. Each means 67 has a lower lower surface 68 which comes to rest upon the top surface of the circuit board, when the head 18 is moved sufficiently downward and a small depending leg 70 extends from the surface 68 and fits into the corners of the aperture in the circuit board. The circuit board is located and held against the fixture plate 32 when the legs 70 and surfaces 68 of members 67 engage therewith.

Figure 5:
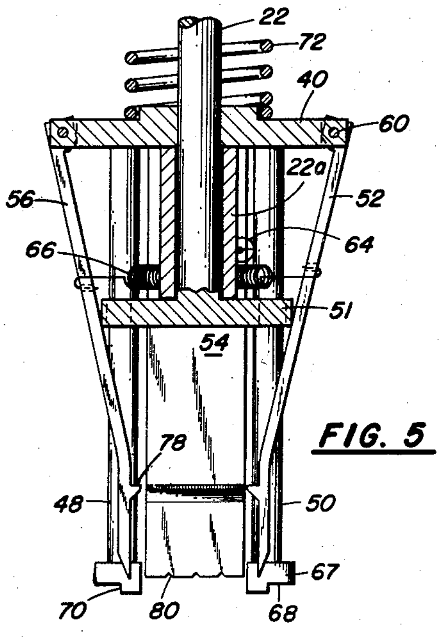
Fig. 5 is a longitudinal sectional view of the head of Fig. 4 and taken substantially on the line 5—5 of Fig. 4 and in the direction of the arrows.
Figure 2:
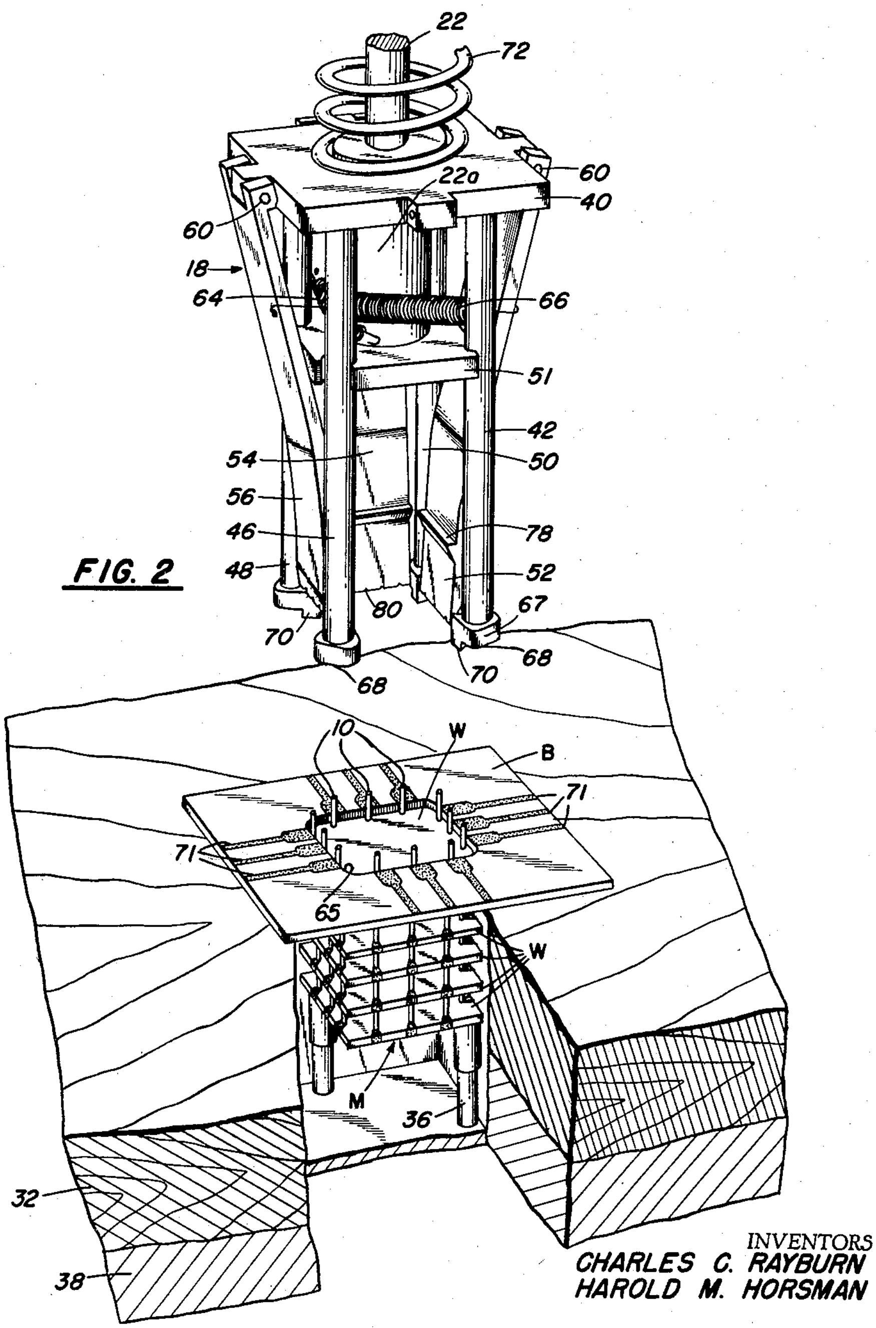
Fig. 2 is a perspective view of the assembly head and supporting fixture, one tool being removed from the head in order to show internal structure.
Figures 3, 4:
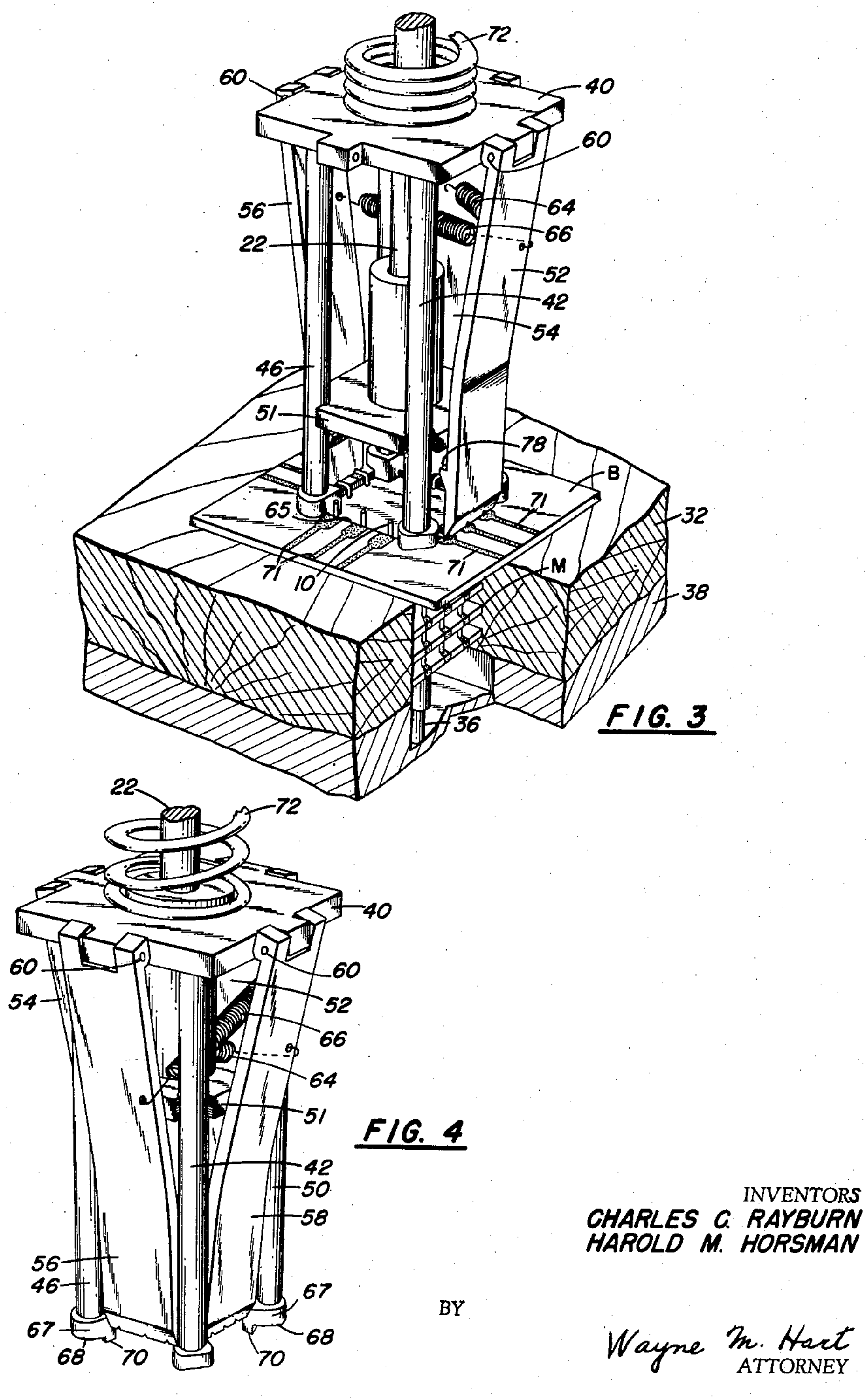
Fig. 3 is a view similar to that of Fig. 2 with the head in another position of operation, that is, the tools are in the process of bending the wires and pressing them tightly against the top surface of the circuit board.
Fig. 4 is a perspective view of the head.

In Figs. 2 and 5, there is illustrated a collar **22*a* which is positioned on the rod 22 between the cam 51 and the plate frame member 40** to limit the retracting movement of the cam to facilitate the positioning of the parts for operation.

*Operation*

A module M is placed in each aperture 34 in the plate 32 upon the yieldable lands or supports 36. A circuit board B, having a central aperture 65 is then placed on top of the fixture plate 32 over each module M so that the upper ends of the wires 10 of each module pass through the aperture 65 in the respective circuit board. The aperture 65 in each circuit board B is made smaller in size than the top wafer W of the respective module M and yet sufficiently large and of a configuration to permit all of the wires 10 of the respective module to pass through the aperture. Wires 10 of the module thus are positioned with each one closely adjacent to the edge of the respective aperture 65 of the circuit board. As an alternative procedure, each module may first be fitted into the aperture 65 of the respective circuit board and then the module and its circuit board as a unit are placed in the fixture so that the module fits in its respective aperture 34 and its associated circuit board B rests on the module slightly above the upper surface of plate 32.

Now, the wires which are passed through the aperture in the board B are ready to be bent over so that they are flat against the top surface of board B in contact with circuitry thereon. Heads 18 and 20 are lowered, as by applying air under pressure to the cylinders 26 and 28. This moves the pistons 22 and 24 and the entire heads downwardly toward the fixture 14. Each head, for example, head 18 is lowered until surfaces 68 come into clamping contact with the top surface of board B. At the same time the legs 70 move into the corners of the board aperture 65 of board B so that the circuit board B will remain fixed relative to the modules during the wire bending operation. When surfaces 68 contact circuit board B additional resistance to further downward movement to head 18 is encountered since the resilient lands 36 hold the module and circuit board out of the aperture 34 a slight amount. Continued downward movement of head 18 moves the circuit board down taking the module M down with it until the board is clamped between the top surface of the fixture plate 32 and surfaces 68 of head 18.

Continued application of force to the head 18 by piston 22 will cause it to move with respect to the frame 40 in which the head is carried. When piston 22 moves with respect to frame 40, the movement is against the compressive force of a spring 72 that seats upon frame 40 and also upon a driving collar 74. This collar is adjustably secured to the piston rod. This movement of piston 22 with respect to frame 40 will actuate the spreader member in a direction to cam the pivotally mounted tools 52, 54, 56 and 58 outwardly.

The sequential operation of this part of the head is that the head is brought down sufficiently low to move the board B firmly against fixture 14 and hold it there. At the same time, however, the lower edges 59 of the tools are brought down along the inside portions of the wires 10 with the grooves in registration therewith. Further application of force to the head through piston 22 moves the cam 51 with respect to the frame 40 and therefore causes the cam to slide against the mating cam surfaces of the tools. This means that the pivotally mounted tools will be displaced outwardly, bending all of the wires 10 which contact them, over into contact with the surface of board B. In bending, the wires fit into the serrations or guide notches 80 formed in the edge 59 of each tool. Continued application of force to piston 22 moves the tools outwardly farther until cam 51 comes to rest upon the stops 78 on the inner surface of each tool. Further application of force on piston 22 provides a downward thrust by the tools on the bent ends of the wires. Upon release of the force on piston 22, and withdrawal of the head 18 by spring 72, the module will be found to be very strongly and firmly connected to the circuit board B by a purely mechanical expedient, that is, the bending of the wires over the edges of the board aperture while the module wafer W engages the undersurface of the circuit panel. If soldering operations are deemed necessary for electrical purposes, no preliminary fastening other than that described is necessary. The wires will stay firmly in place upon the circuitry 71 of board B until a soldering connection is made.

It is understood that various departures may be made from the described embodiment of the invention without departing from the scope of the following claims.

What is claimed is:

1. A machine to connect an object having spaced groups of wires protruding from one end with a panel having a square aperture which is smaller than said end, and having said groups of wires passed therethrough near walls of the aperture, said machine comprising a support, a fixture on the support to retain said object and panel, a head, means connecting said head to the support for movement toward said fixture, said head including depending spaced guide members having lower end surfaces adapted to come to rest upon a surface of the panel and legs depending therefrom to contact junction portions of the panel wall forming the aperture and thereby hold the panel stationary, wire bending tools pivotally supported on said head and having wire guides approximately coplanar with said members' surfaces so that when the members are in contact with the panel said tools are brought along side of the wires which protrude through the panel aperture, and cam means slidable on said guide members for pivotally actuating said tools to engage the guides thereof with the wires and bend the latter against the surface of the panel.

2. For use in assembling an object having groups of wires protruding from one end with a panel having an aperture smaller than said end but sufficiently large to accommodate the wires, an apparatus comprising a support, a drive member carried by said support, a head, a plurality of tools displaceably carried by said frame, means yieldingly connecting said head with said drive member so that said head may be moved to a position where portions of said tools are alongside of the wires, depending guide members secured to said head and movable therewith for contacting at their depending edges and holding the panel in a fixed position when said tools are alongside of said wires, and a cam operable on said guide members and secured to said drive member and in contact with surfaces of said tools which are contoured to cause displacement of the tools in response to movement of said cam thereon and thereby bend the protruding ends of the wires upon said panel.

3. For use in assembling a device having groups of wires protruding from one end to a square aperture in a panel smaller than said end but sufficiently large to accommodate the wires, an apparatus comprising a support, a drive member carried by said support, a head, a plurality of tools pivoted at one end to said head, means yieldably connecting said head with said drive member so that the said head may be moved to a position where portions of said tools are alongside of the protruding wires, depending guide members fixed to said head and movable therewith for contacting at their depending ends and clamping the panel in fixed position when said tools are alongside of said wires, legs depending from the clamping ends of said guide members in relation to engage the junction of walls of the panel forming the aperture to thereby center and prevent rotation of the panel, and a cam operable on said guide members and secured to said drive member and in contact with surfaces of said tools which are contoured to cause displacement of the tools in response to movement of said cam thereagainst to thereby bend the protruding ends of the wires against said panel.

4. A machine for assembling a device having an assemblage of parallel wires radiating therefrom to a planar member at an aperture formed therein, the wires arranged to extend through the aperture, comprising in combination a frame member, driving means carried by said frame member, a head carried by an axially movable by and relative to said driving means toward and away from said aperture, resilient means coupling said driving means with said head to allow relative axial motion therebetween, a plurality of tools respectively pivotally mounted at one end to said head and the other end adapted to be positioned adjacent the ends of the wires projecting through said planar member aperture, a cam rigidly coupled to said driving means and slidably engaging said tools to pivot the same whereby said other tool ends bend the wires over the panel adjacent the aperture thereon, and stop means on each tool to arrest relative motion between said cam and said tools whereby further movement of the cam will impart downward thrust by the tools against the bent wires.

5. In a device for bending a plurality of wire terminals downwardly against a planar marginal surface defining an aperture in a work piece, comprising a reciprocating rod and a head assembly mounted for movement on said rod, said head assembly including a plate member having a central opening receiving said rod, a plurality of fixed spaced depending posts carried by said plate, said posts each having foot portions for engagement with the work, said foot portions having projections for seating against the inner marginal surface defining the aperture, a plurality of depending spreader members hinged to said plate and interposed between said posts, a cam member carried by the end portion of said reciprocating rod for actuating said spreader members, said cam member having recesses engaging said depending posts for guiding association therewith, spring means normally urging said spreader members inwardly against said cam member, and spring means positioned on said reciprocating rod and engaging the upper face of said plate member for normally urging the cam toward the plate member to allow inward movement of said spreader members.

6. The structure of claim 5 characterized in that means are positioned on the reciprocating rod between the plate member and the cam member to limit the retraction of the rod.

References Cited in the file of this patent

UNITED STATES PATENTS

| | | |
|---|---|---|
| 1,169,339 | Maynard | Jan. 25, 1916 |
| 1,664,619 | Girard | Apr. 3, 1928 |
| 1,854,371 | Engel | Apr. 19, 1932 |